United States Patent [19]

Plies et al.

[11] Patent Number: 4,748,324
[45] Date of Patent: May 31, 1988

[54] ELECTROSTATIC OPPOSING FIELD SPECTROMETER FOR ELECTRON BEAM TEST METHODS

[75] Inventors: Erich Plies, Munich; Wilhelm Argyo, Osterwarngau, both of Fed. Rep. of Germany

[73] Assignee: Siemens Aktiengesellschaft, Berlin and Munich, Fed. Rep. of Germany

[21] Appl. No.: 857,965

[22] Filed: May 1, 1986

[30] Foreign Application Priority Data

May 31, 1985 [DE] Fed. Rep. of Germany ....... 3519585

[51] Int. Cl.$^4$ .............................................. H01J 40/00
[52] U.S. Cl. ..................................... 250/305; 250/310
[58] Field of Search ....................... 250/305, 310, 309; 324/73 R, 73 PC

[56] References Cited

U.S. PATENT DOCUMENTS 3,731,096  5/1973  Carter ................................. 250/305
3,783,280  1/1974  Watson ................................ 250/305
4,464,571  8/1984  Plies .................................... 250/305

OTHER PUBLICATIONS

H. P. Feuerbaum, "VLSI Testing Using the Electron Probe", 1979/I Scanning Electron Microscopy, SEM Inc., AMF O'Hare, IL 60666, USA, 285–296.

Primary Examiner—Bruce C. Anderson
Attorney, Agent, or Firm—Hill, Van Santen, Steadman & Simpson

[57] ABSTRACT

A deflection element for an electrostatic opposing field spectrometer includes a grid electrode at a positive potential and a deflection electrode at a negative potential disposed symmetrically thereto, as well as housing portions disposed between the grid electrode and the deflection electrode, so that together they form a generated surface of a hollow cylinder disposed concentric to an optical axis of the spectrometer.

11 Claims, 4 Drawing Sheets

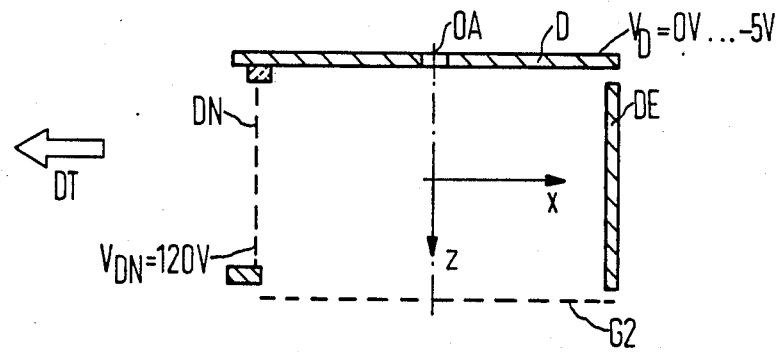
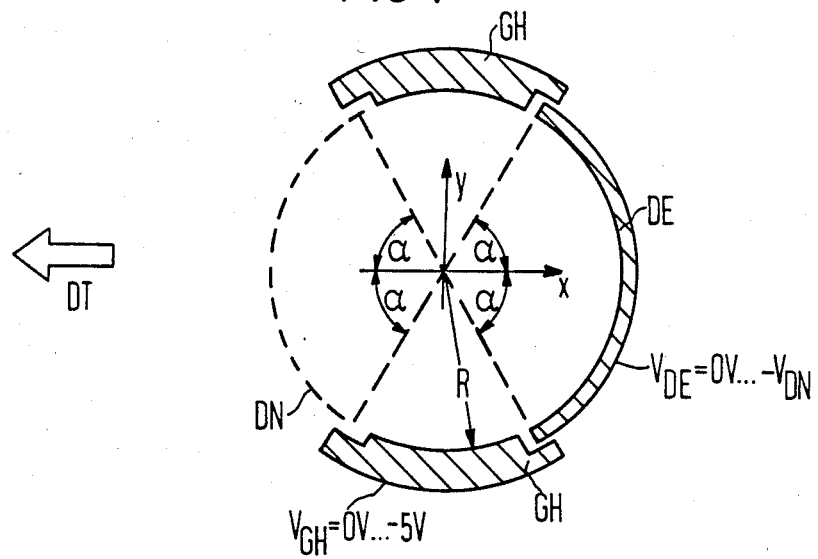

ELECTROSTATIC OPPOSING FIELD SPECTROMETER FOR ELECTRON BEAM TEST METHODS

BACKGROUND OF THE INVENTION

1. Field of the Invention

The present invention relates generally to an electrostatic opposing field spectrometer and, more specifically, to an electrode arrangement for such spectrometer.

2. Description of the Prior Art

The functioning of integrated circuits is usually automatically checked with computer controlled test installations. In most instances, however, such tests are incomplete since perceived faults in the integrated circuits are difficult to localize. Additional measurements must therefore be performed inside of the integrated circuits, particularly during the development phase. Electron beam test instruments which test non-destructively and without contact are particularly well suited for such tests and are being increasingly used in all areas for the development and manufacture of micro-electronic components.

Particularly good information for localizing faults in large scale integrated (LSI) circuits are obtainable from quantitative waveform measurements at selected nodes of the components during testing. For example, a primary electron beam generated in an electron optical column of a modified scanning electron microscope is positioned at a measuring point and the shift of the energy distribution of the secondary electrons triggered at the measuring point is identified in a spectrometer. The energy shift is dependent upon the voltage, or potential, of the component measuring point.

The publication of H.P. Feuerbaum in "SEM/1979/I, SEM Inc., ANF O'Hare, Illinois, 60666", pages 285-296 discloses an electrostatic opposing field spectrometer. The spectrometer includes a deflection element disposed above an extraction and retarding field electrode. Any secondary electrons which are on axially remote paths in the proximity of the housing parts are only weakly deflected by the deflection element due to its asymmetrical structure and do not contribute to the measured signal of the secondary electron detector. Low secondary electron currents lead to poor signal-to-noise ratios and limit the resolution with which voltages, or potentials, can be measured.

U.S. Pat. No. 4,464,571 discloses an electrode arrangement for an opposing field spectrometer which generates a spherically symmetrical opposing field.

SUMMARY OF THE PRESENT INVENTION

It is an object of the present invention to provide an opposing field spectrometer having a deflection element with an improved acceptance to provide improved spectrometer resolution. This and other objects are achieved in an electrostatic opposing field spectrometer electrode arrangement having first and second symmetrically opposed deflection electrodes. The first and second deflection electrodes deflect and accelerate secondary electrons in the direction of an electron detector. In a preferred embodiment, the first and second symmetrical deflection electrodes form portions of a hollow cylinder symmetrically arranged with respect to an optical axis of the spectrometer.

An opposing field spectrometer according to the present invention offers the advantage of improved signal-to-noise ratio and enhanced resolution in quantitative voltage measurements.

BRIEF DESCRIPTION OF THE DRAWINGS

FIG. 3 is a vertical cross-section of a portion of an electrostatic opposing field spectrometer according to the principles of the present invention;

FIG. 4 is a horizontal cross-section perpendicular to the optical axis of the spectrometer portion shown in FIG. 3;

DESCRIPTION OF THE PREFERRED EMBODIMENTS

Figure 1:
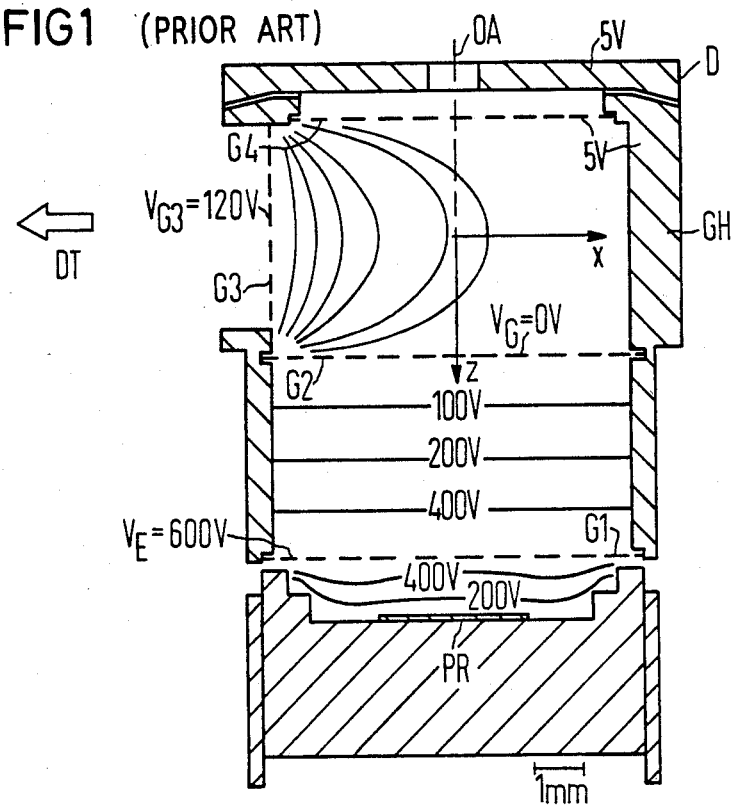
FIG. 1 is a schematic cross-section of an electrostatic opposing field spectrometer of the prior art.

Quantitative measurements of potential on an integrated circuit are made by positioning the primary electron beam generated in an electron optical column of an electron beam measuring instrument at the measuring point to be investigated. Secondary electrons are generated thereby and the shift of their energy distribution is measured with an opposing field spectrometer. The energy distribution shift is dependent upon the potential at the measuring point being impinged by the primary electron beam. FIG. 1 shows an electrostatic opposing field spectrometer for such measurement which is known in the art and, in particular, from the above-identified publication of Feuerbaum, so that the structure and function thereof will only be briefly discussed hereinafter.

Local micro-fields at the specimen surface are suppressed by a strong extraction field of, for example, 6 kV/cm that is generated by a planar extraction electrode G1 positioned immediately above the specimen PR. Secondary electrons that are triggered at the measuring point are accelerated in the direction of the grid electrode G1, after which the secondary electrons encounter a retarding opposing field between the electrodes G1 and G2. A potential barrier level is set at the opposing field electrode G2 by a voltage $V_G$. The potential barrier level defines that fraction of the secondary electrons which proceed into the deflection element. The height of the potential barrier is selected such that only the high energy secondary electrons which are barely influenced by the local electrical fields at the specimen surface contribute to the measured signal. Secondary electrons which have kinetic energies above this potential barrier pass the opposing field electrode G2 and proceed into the deflection element of the secondary electron spectrometer. The secondary electrons are deflected into the field of a planar grid electrode G3 lying at a potential of $V_{G3}$ so that they are laterally accelerated in the direction of the arrow to a detector DT (not shown). In one example, the potential $V_{G3}$ is 120 volts.

Measuring precision is improved by the addition of a further planar grid electrode G4 under the spectrometer cover D. The grid electrode G4 intercepts secondary electrons triggered in the region of the cover D by fast backscatter electrons.

Figure 2:
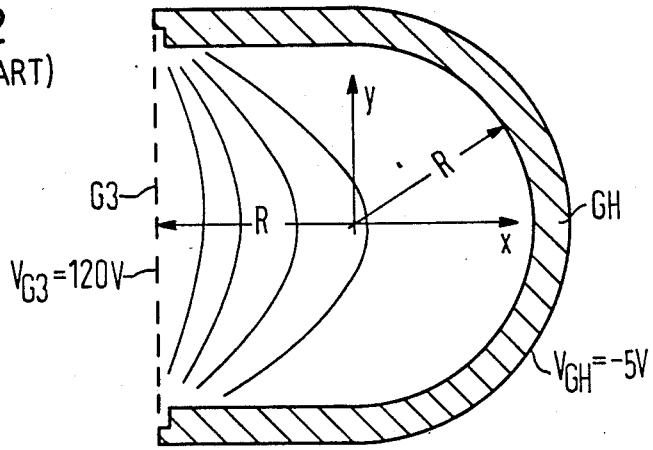
FIG. 2 is a deflection element of the spectrometer shown in FIG. 1 taken in section perpendicular to the optical axis.

FIG. 2 is a horizontal section through the deflection portion of the prior art spectrometer taken perpendicular to the optical axis. Due to the asymetrical structure of the housing GH, any secondary electrons on axially remote paths in the proximity of the housing GH are only weakly deflected thereby and, thus, are not detected by the detector.

According to the present invention, deflection elements shown in FIGS. 3 and 4 are integrated in an opposing field spectrometer similar to that shown in FIG. 1. The deflection element shown in FIG. 3 includes a grid electrode DN having a positive potential of $V_{DN}$. A deflection electrode DE is arranged symmetrically to the grid electrode DN and lies at a negative potential $V_{DE}$. Housing portions GH are disposed between the electrodes DE and DN so that the overall deflection element forms a generated surface of a hollow cylinder lying concentric to the primary beam axis. Thus, the symmetry axis of the deflection element and the optical axis OA coincide.

To deflect nearly all of the secondary electrons proceeding into the deflection element via the opposing field electrode G2 in the direction toward the detector an angle $2\alpha$ should be between 100° and 140° and in one preferred embodiment is 120°. The angle $2\alpha$ is that portion of the generated cylinder surface which the deflection electrode DE or, respectively, the net shaped electrode DN, form.

An additional grid electrode similar to the grid G4 of FIG. 1 can also be provided for intercepting the secondary electrons triggered at the spectrometer cover D by backscatter electrons. In comparison with the known arrangements of FIGS. 1 and 2, the spectrometer of the present invention is distinguishable by, among other things, an improved extraction of the secondary electrodes, since the grid electrode DN which forms a part of a cylindrically generated surface lies closer to the optical axis OA than the edge portions of the planar deflection network G3 of FIG. 2. Additionally, secondary electrons which are on axially remote paths in the proximity of the deflection electrode DE at a relatively great distance from the grid electrode DN are also laterally accelerated in the direction of the grid electrode DN. Thus, an increased secondary electron current is measured in the detector for improved spectrometer performance.

An optimum spectrometer characteristic is achieved by matching the voltage $V_{DE}$ of the extraction electrode DE to the voltage $V_{DN}$ of the grid electrode DN. Preferably, a voltage $V_{DE}$ between 0 volts and $-(V_{DN})$ is applied to the deflection electrode DE, for positive grid electrode voltages $V_{DN}$.

Particularly good performance is achieved when the deflection electrode DE and the grid electrode DN lie at oppositely identical potentials, for example, where the voltage $V_{DE}$ equals the negative of the voltage $V_{DN}$. For such opposite identical potentials, the electrical field in the deflection element is anti-symmetrical and the double-numbered quadrupole component of the field around the optical axis OA disappears.

Figure 5:
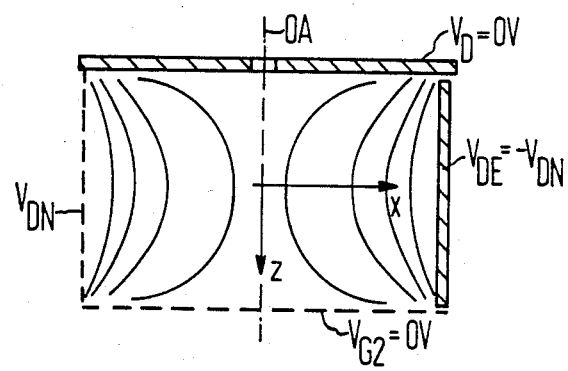
FIG. 5 is a schematic diagram of the potential distribution within the spectrometer electrode shown in FIG. 3.
Figure 6:
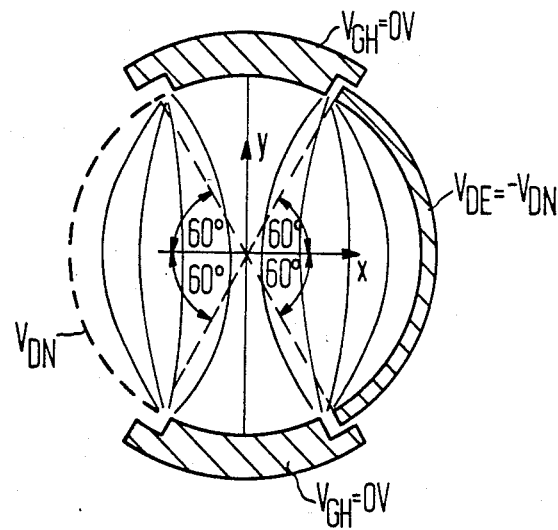
FIG. 6 is a schematic diagram of the potential distribution within an electrode arrangement as shown in FIG. 4.

For an angle $\alpha$ equals 60°, the three-fold hexapole component of the field disappears so that two-fold and three-fold astigmatism of the primary electron beam is, to a large extent, avoided. FIGS. 5 and 6 show the potential distribution built up within the deflection element of the present invention under such conditions.

Figure 7:
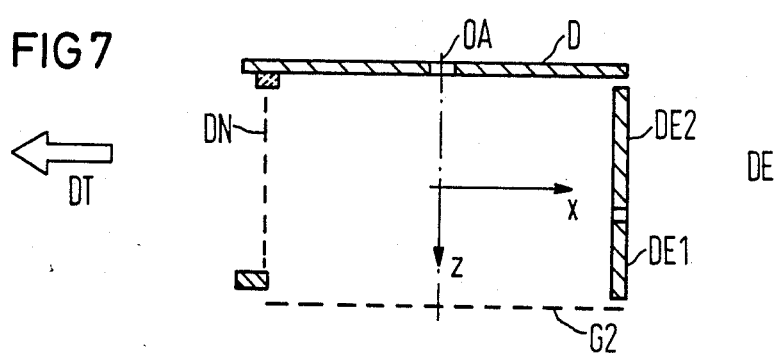
FIG. 7 is another embodiment of a portion of an electrostatic opposing field spectrometer according to the principles of the present invention.

The presence of a deflection electrode DE lying at a high negative potential $V_{DE}$ causes the opposing field electrode G2 to impede the passage of secondary electrons which are on axially remote paths running in the proximity of the electrode DE. The transmission of secondary electrons through the opposing field electrode G2 in the region of the deflection electrode DE is increased by the embodiment illustrated in FIG. 7, wherein the deflection electrode DE is divided in a plane perpendicular to the optical axis OA. A first portion DE1 of the deflection electrode DE is disposed immediately above the opposing field electrode G2 and is at a smaller potential than that of an upper portion DE2 of the deflection electrode DE.

Figure 8:
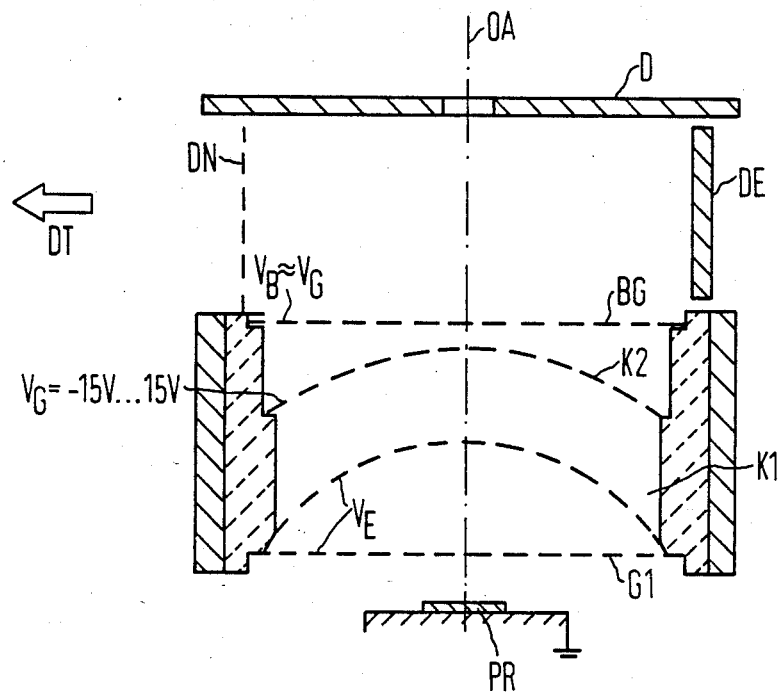
FIG. 8 is a cross-section of a further embodiment of an electrostatic opposing field spectrometer of the present invention.

In FIG. 8 is shown an embodiment of an opposing field spectrometer of the present invention having deflection elements similar to those shown in FIGS. 3 and 4 and an electrode arrangement as disclosed in U.S. Pat. No. 4,464,571, which generates a spherically symmetrical opposing field that isotropically retards secondary electrons. A spherically symmetrical network K1 lies at a same high positive potential VE as the extraction electrode G1. A spherically symmetrical network K2 acts as an opposing field electrode and is held at a voltage $V_G$ between $+15$ volts and $-15$ volts. In order to avoid punch-through of the positive voltage $V_{DN}$ adjacent the grid electrode DN into the retarding space between the spherically symmetrical grid electrodes K1 and K2, a shielding grid BG is provided between the spherically symmetrical network K2 and the deflection element. The shielding grid is held roughly at the same potential $V_G$ as the spherically symmetrical network K2.

Figure 9:
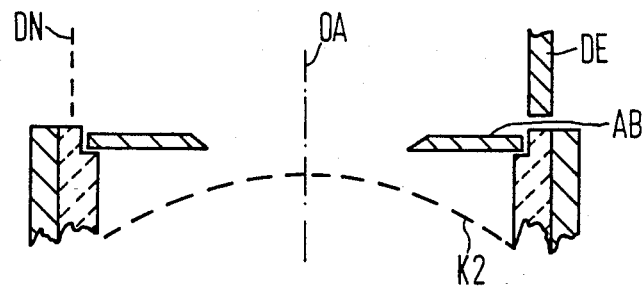
FIG. 9 is yet another embodiment of the present device.

Referring to FIG. 9, a shielding diaphragm AB is used in place of the shielding grid BG of FIG. 8. It is also within the spirit of the present invention to provide a diaphragm below a shielding network.

As is apparent from the foregoing specification, the invention is susceptible to being embodied with various alterations and modifications which may differ particularly from those that have been described in the preceeding specification and description. It should be understood that we wish to embody within the scope of the patent warranted hereon all such modifications as reasonably and properly come within the scope of our contribution to the art.

We claim:

1. An electrostatic opposing field spectrometer for measuring a shift in the energy-distribution of secondary electrons triggered on a specimen by primary particles comprising:
   a first electrode system arranged immediately above the specimen for accelerating the secondary electrons triggered at the specimen by a beam of the primary particles proceeding along a beam axis;
   a second electrode system toward which said first electrode system accelerates the secondary electrons, said second electrode system being charged with voltages that establish an electrical field for decelerating the secondary electrons;

a deflection unit disposed above said second electrode system for deflecting the secondary electrons;

said deflection unit including a third electrode charged with a first voltage and a fourth electrode disposed opposite said third electrode and charged with a second voltage, said third and fourth electrodes being fashioned to form parts of a generated surface of a hollow cylinder having an axis of symmetry coincident with the beam axis; and a detector toward which said deflection unit deflects the secondary electrons.

2. An electrostatic opposing field spectrometer as claimed in claim 1, wherein said first and second voltages are of opposite signs, and an absolute value of said second voltage is less than or equal to an absolute value of said first voltage.

3. An electrostatic opposing field spectrometer as claimed in claim 1, wherein said deflection unit includes housing parts that form parts of the generated surface of the hollow cylinder defined by said third and fourth electrodes.

4. An electrostatic opposing field spectrometer as claimed in claim 1, wherein said third and fourth deflection electrodes each define an angle of the generated cylinder surface concentric to the optical axis, said angle being between 100° and 140° inclusive.

5. An electrostatic opposing field spectrometer as claimed in claim 4, wherein said angle is substantially 120°.

6. An electrostatic opposing field spectrometer as claimed in claim 1, wherein said third and fourth deflection electrodes are at potentials of opposite sign and substantially equal amplitude.

7. An electrostatic opposing field spectrometer as claimed in claim 1, wherein said fourth deflection electrode is divided into first and second parts at a plane perpendicular to the optical axis, said first part being superjacent to the opposing field electrode and said second part being adjacent said first part on an opposite side from the opposing field electrode, said first part being at a lower amplitude potential than said second part.

8. An electrostatic opposing field spectrometer as claimed in claim 1, further comprising:

a shielding grid provided between said second electrode system and said deflection and acceleration means.

9. An electrostatic opposing field spectrometer as claimed in claim 1, further comprising:

a shielding diaphragm provided between said second electrode system and said deflection and acceleration means.

10. An electrostatic opposing field spectrometer as claimed in claim 1, wherein said second electrode system includes a planar opposing field electrode.

11. An electrostatic opposing field spectrometer as claimed in claim 1, wherein said second electrode system includes a pair of spherically symmetrical grid electrodes mounted for generating a spherically symmetrical opposing field.

* * * * *